(12) United States Patent
Shioga

(10) Patent No.: US 11,044,830 B2
(45) Date of Patent: Jun. 22, 2021

(54) LOOP HEAT PIPE AND ELECTRONIC DEVICE

(71) Applicant: FUJITSU LIMITED, Kawasaki (JP)

(72) Inventor: Takeshi Shioga, Atsugi (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/877,547

(22) Filed: May 19, 2020

(65) Prior Publication Data

US 2020/0281096 A1 Sep. 3, 2020

Related U.S. Application Data

(63) Continuation of application No. PCT/JP2017/042853, filed on Nov. 29, 2017.

(51) Int. Cl.
*H05K 7/20* (2006.01)
*H01L 23/427* (2006.01)
(Continued)

(52) U.S. Cl.
CPC ........ *H05K 7/20336* (2013.01); *F28D 15/043* (2013.01); *G06F 1/203* (2013.01);
(Continued)

(58) Field of Classification Search
CPC .......... H05K 7/20309; H05K 7/20318; H05K 7/20327; H05K 7/20336; H05K 23/427; F28D 15/0266
See application file for complete search history.

(56) References Cited

U.S. PATENT DOCUMENTS 6,014,312 A * 1/2000 Schulz-Harder ........ F28F 3/086
165/80.4
6,386,278 B1 * 5/2002 Schulz-Harder ........ F28F 3/083
165/146

(Continued)

FOREIGN PATENT DOCUMENTS

JP H09-264681 A 10/1997
JP 2000-146471 A 5/2000
(Continued)

OTHER PUBLICATIONS

International Search Report and Written Opinion of the International Searching Authority (Form PCT/ISA/210 and 237), mailed in connection with PCT/JP2017/042853 and dated Feb. 27, 2018 (9 pages).

*Primary Examiner* — Robert J Hoffberg
(74) *Attorney, Agent, or Firm* — Fujitsu Patent Center

(57) ABSTRACT

A loop heat pipe includes an evaporator configured to evaporate a liquid phase working fluid to generate vapor, the evaporator including first and second inner surfaces that face each other; a comb-like porous body including a plurality of comb teeth, the comb-like porous body being disposed inside the evaporator; a plurality of grooves disposed on one of the first inner surface and second inner surface so as to overlap the plurality of comb teeth; a vapor transport line configured to transport the vapor of the working fluid; a condenser configured to liquefy the vapor of the working fluid; and a liquid transport line configured to transport the liquified vapor as a liquid phase working fluid, wherein each of the liquid transport line and the vapor transport line connects the evaporator and the condenser, such that the vapor transport line and the liquid transport line form a loop-like flow passage.

9 Claims, 23 Drawing Sheets

(51) Int. Cl.
  *F28D 15/02* (2006.01)
  *F28D 15/04* (2006.01)
  *G06F 1/20* (2006.01)

(52) U.S. Cl.
  CPC ....... *H01L 23/427* (2013.01); *H05K 7/20309* (2013.01); *H05K 7/20318* (2013.01); *H05K 7/20327* (2013.01); *F28D 15/0266* (2013.01)

(56) References Cited

U.S. PATENT DOCUMENTS

| | | | | |
|---|---|---|---|---|
| 8,705,236 | B2* | 4/2014 | Uchida | H01L 23/427 |
| | | | | 361/700 |
| 10,215,497 | B2* | 2/2019 | Noishiki | F28D 9/0037 |
| 10,524,388 | B2* | 12/2019 | Machida | F28D 15/043 |
| 10,624,238 | B2* | 4/2020 | Shioga | H01L 21/4882 |
| 10,704,838 | B2* | 7/2020 | Machida | F28D 15/046 |
| 10,809,012 | B2* | 10/2020 | Machida | F28D 15/0266 |
| 10,859,319 | B2* | 12/2020 | Machida | F28D 15/046 |
| 10,881,021 | B2* | 12/2020 | Shioga | H05K 7/20336 |
| 10,976,111 | B2* | 4/2021 | Machida | F28D 15/043 |
| 2013/0083482 | A1 | 4/2013 | Uchida et al. | |
| 2016/0259383 | A1* | 9/2016 | Shioga | G06F 1/203 |
| 2018/0177077 | A1 | 6/2018 | Shioga et al. | |
| 2019/0234692 | A1* | 8/2019 | Kiso | F28D 15/0233 |
| 2019/0242652 | A1* | 8/2019 | Machida | F28D 15/043 |
| 2019/0316848 | A1* | 10/2019 | Tseng | F28D 15/046 |
| 2019/0331432 | A1* | 10/2019 | Tseng | F28D 15/0275 |
| 2019/0368820 | A1* | 12/2019 | Machida | H01L 23/3736 |
| 2021/0116184 | A1* | 4/2021 | Machida | F28D 15/046 |

FOREIGN PATENT DOCUMENTS

| | | |
|---|---|---|
| JP | 2011-204851 A | 10/2011 |
| JP | 2012-043954 A | 3/2012 |
| JP | 2013-072627 A | 4/2013 |
| JP | 2015-200465 A | 11/2015 |
| JP | 2016-142416 A | 8/2016 |
| JP | 2017-110869 A | 6/2017 |
| WO | WO2015/087451 A1 | 6/2015 |
| WO | WO2017/037921 A1 | 3/2017 |

* cited by examiner

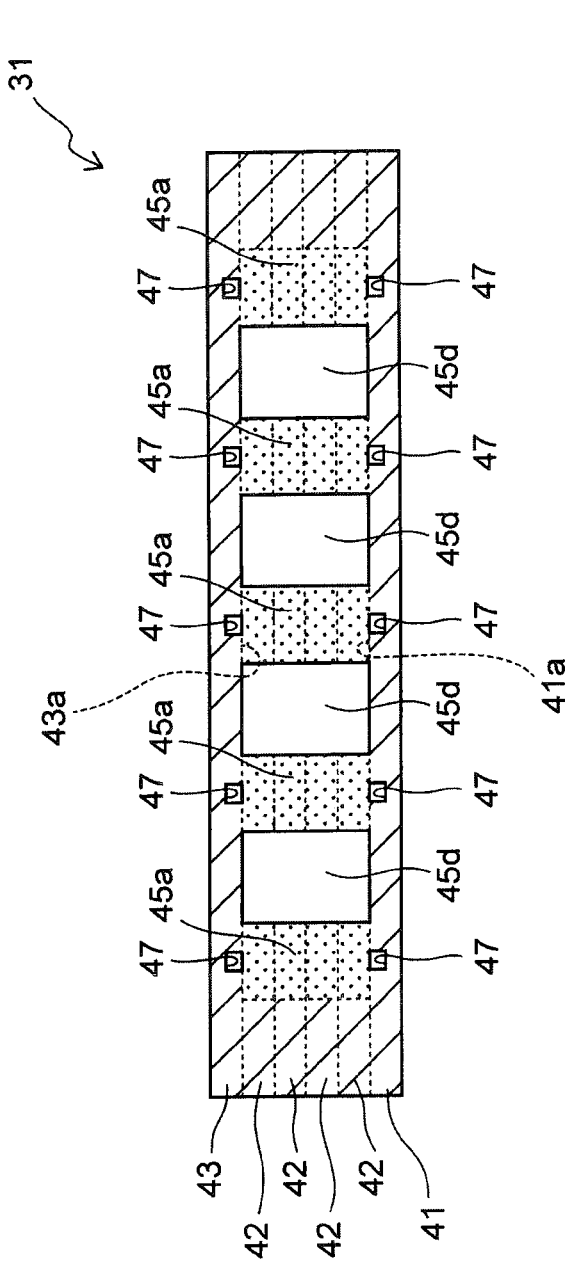
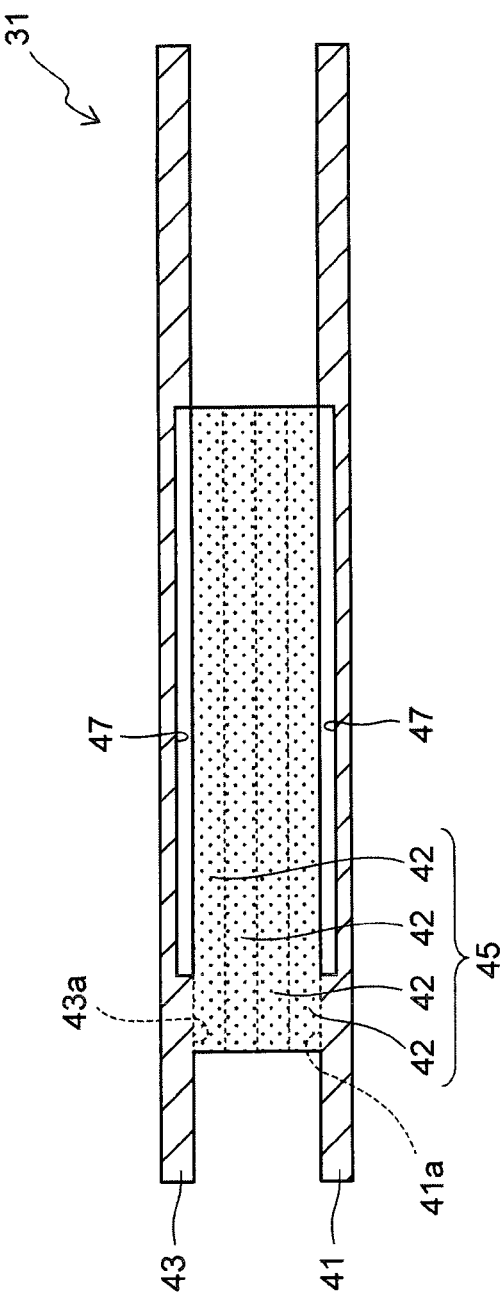
FIG.17A
FIG.17B

LOOP HEAT PIPE AND ELECTRONIC DEVICE

CROSS-REFERENCE TO RELATED APPLICATIONS

This application is a continuation application of International Application PCT/JP2017/042853 filed on Nov. 29, 2017 and designated the U.S., the entire contents of which are incorporated herein by reference.

FIELD

The disclosure discussed herein relates to a loop heat pipe and an electronic device.

BACKGROUND

With the advent of the advanced information society, electronic mobile devices such as smartphones and tablet terminals are becoming popular. Since these electronic mobile devices are equipped with heat generating components such as a CPU (Central Processing Unit), various methods have been proposed for cooling the heat generating components disposed in the electronic mobile devices.

One of the methods for cooling the heat generating components may be use of metal plates or thermal diffusion sheets having superior thermal conductivity for transporting heat from the heat generating components to outside. However, in this method, the amount of heat that can be transported is restricted by thermal conductivities of metal plates or thermal diffusion sheets. For example, as a thermal diffusion sheet, a graphite sheet may be used, and the thermal conductivity of a graphite sheet is in a range of 500 W/mK to 1500 W/mK. This indicates that when a heat generating component in the electronic mobile device generates a large amount of heat, it may be difficult for the graphite sheet to transfer heat from the heat generating component.

Alternatively, heat pipes may be considered as a device that can actively cool the heat generating components.

Heat pipes are a device for transporting heat by using a vapor-liquid phase change of a working fluid. The heat pipes are enabled to transport heat more efficiently than the thermal diffusion sheets described above. For example, when a heat pipe having a diameter of 3 mm to 4 mm is used for cooling a heat generating component, the effective thermal conductivity converted from the heat transfer performance of the heat pipe is in a range of 1500 W/mK to 2500 W/mK, which is a quite large value.

There are several types of heat pipes, one of which is a loop heat pipe. A loop heat pipe includes an evaporator configured to vaporize a working fluid by using heat from a heat generating component, and a condenser configured to cool and liquefy the vaporized working fluid. The evaporator and the condenser are each connected to a liquid transport line and to a vapor transport line to form a loop-like flow passage, through which the working fluid flows in one direction.

As described above, the loop heat pipe is characterized by causing a working fluid to flow in one direction, and the resistance to the working fluid in the loop heat pipe is smaller than in the heat pipe. This is because in the heat pipe, a vapor phase working fluid and a liquid phase working fluid reciprocate in one flow passage. The loop heat pipe is thus enabled to more efficiently transport heat compared to the heat pipe.

However, the loop heat pipe may be susceptible to an incident called heat leakage. Heat leakage is an incident where heat that should be entering an evaporator accidentally flows back to a liquid transport line. When heat leakage occurs in the loop heat pipe, the heat transport performance of the loop heat pipe drastically degrades as noted below.

The heat input to the evaporator $Q_{in}$ is the sum of the heat used to evaporate a working fluid $Q_{evp}$ and the heat back into a liquid transport line due to heat leakage $Q_{HL}$.

This may be expressed by an equation "$Q_{evp}=Q_{in}-Q_{HL}$". When the input heat $Q_{in}$ is constant and the heat leakage $Q_{HL}$ due to heat leakage becomes large, the amount of heat used to evaporate a working fluid $Q_{evp}$ becomes small. Thus, vapor generated by the evaporator becomes small.

As a result, a longer time may be required to transport heat from the evaporator to the condenser, and a longer start-up time may be required from an input of heat to the evaporator to a start of transporting heat. In addition, when only a small amount of vapor is generated by the evaporator, heat may fail to be efficiently transported from the evaporator to the condenser, thereby degrading the heat transport performance of the loop heat pipe.

Specifically, when the loop heat pipe is embedded in a thinned electronic device such as a smartphone, a flow passage of the loop heat pipe must be thinned in accordance with the thickness of the thinned electronic device. This may inhibit a working fluid from flowing through the flow passage, thereby causing a delay in the start-up time of the loop heat pipe due to heat leakage. This results in a significant degradation in the heat transport performance of the loop heat pipe.

RELATED ART DOCUMENTS

Patent Documents

Patent Document 1: International Publication Pamphlet No. WO2015/087451
Patent Document 2: Japanese Unexamined Patent Publication No. H09-264681
Patent Document 3: Japanese Unexamined Patent Publication No. 2000-146471

SUMMARY

It is an object of the present invention to provide a loop heat pipe capable of being activated quickly, and an electronic device having such a loop heat pipe.

According to one aspect, a loop heat pipe is provided. The loop heat pipe includes an evaporator configured to evaporate a liquid phase working fluid to generate vapor, the evaporator including a first inner surface and a second inner surface, the first inner surface and the second inner surface facing each other;

a comb-like porous body including a plurality of comb teeth in a plan view, the comb-like porous body being disposed inside the evaporator;

a plurality of grooves disposed on at least one of the first inner surface and the second inner surface, such that the plurality of grooves respectively overlap the plurality of comb teeth in a plan view;

a vapor transport line configured to transport the vapor of the working fluid;

a condenser configured to liquefy the vapor of the working fluid; and a liquid transport line configured to transport the liquefied vapor as a liquid phase working fluid, wherein each of the liquid transport line and the vapor transport line connects the evaporator and the condenser, such that the vapor transport line and the liquid transport line form a loop-like flow passage.

The object and advantages of the invention will be realized and attained by means of the elements and combinations particularly pointed out in the appended claims.

It is to be understood that both the foregoing general description and the following detailed description are exemplary and explanatory and are not restrictive of the invention as claimed.

BRIEF DESCRIPTION OF DRAWINGS

FIG. 17A is a cross-sectional view illustrating the evaporator, which is cut along a XVIIA-XVIIA line of FIG. 15, and FIG. 17B is a cross-sectional view illustrating the evaporator, which is cut along a XVIIB-XVIIB line of FIG. 15;

DESCRIPTION OF EMBODIMENTS

Before describing the present embodiment, a related art technology reviewed by the inventors of the present application will be described.

Figure 1:
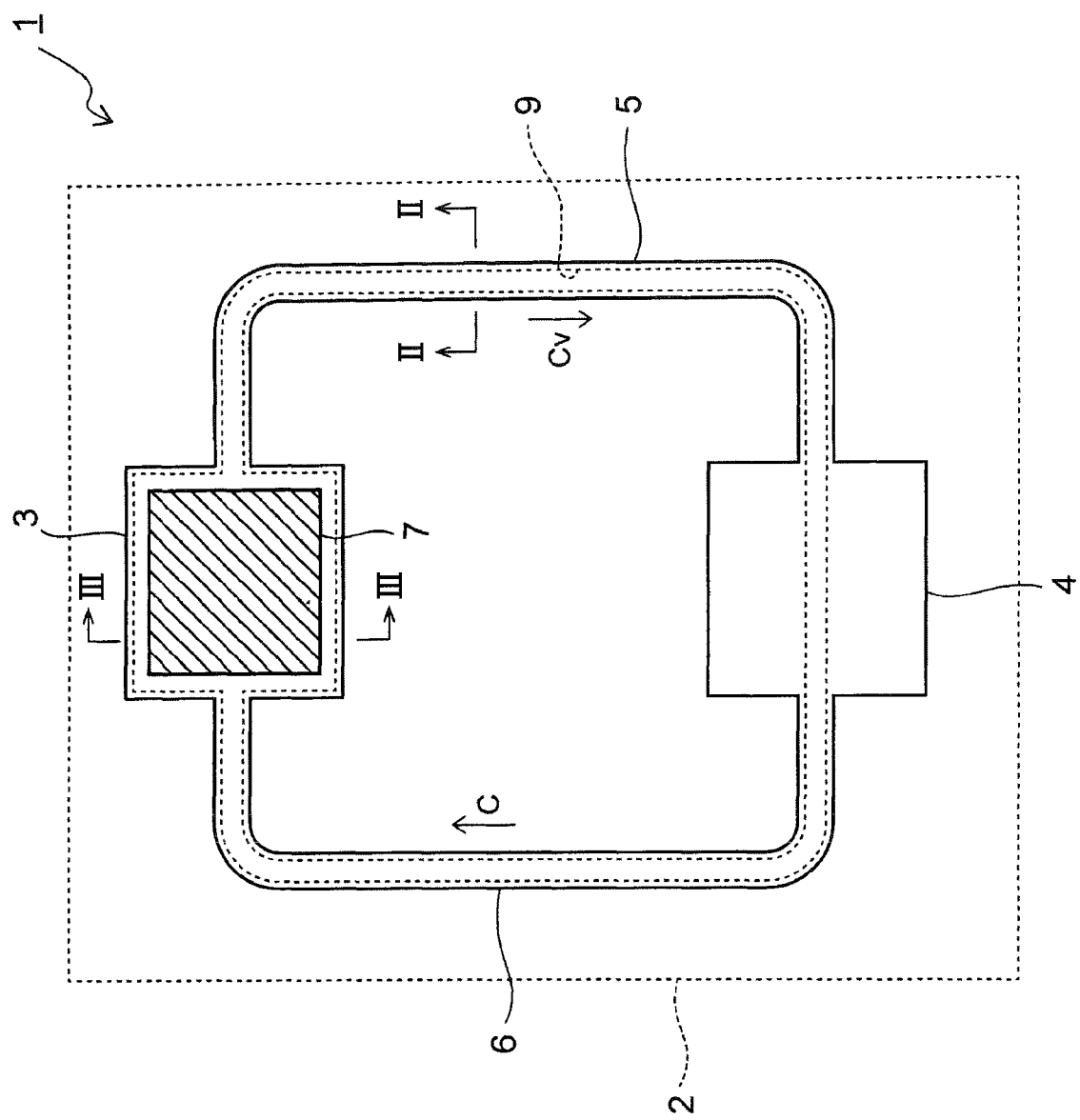
FIG. 1 is a plan view illustrating a loop heat pipe used in a related art review.

FIG. 1 is a plan view illustrating a loop heat pipe used in the related art review.

A loop heat pipe 1 is embedded in a case 2 of, for example, a smartphone, a tablet PC, and a digital camera. The loop heat pipe 1 includes an evaporator 3 and a condenser 4.

Each of the evaporator 3 and the condenser 4 is connected to a vapor transport line 5 and to a liquid transport line 6, so that the vapor transport line 5 and the liquid transport line 6 form a loop-like flow passage 9, through which a working fluid C flows. In addition, a heat generating component 7 such as a CPU is fixed to the evaporator 3, so that vapor Cv of the working fluid C is generated by using heat of the heat generating component 7.

The generated vapor Cv is guided through the vapor transport line 5 to the condenser 4, where the vapor Cv is liquefied. The liquefied vapor Cv is subsequently supplied through the liquid transport line 6 to the evaporator 3 again.

As described above, while the working fluid C circulates inside the loop heat pipe 1, heat generated by the heat generating component 7 is transferred to the condenser 4, thereby lowering the temperature of the heat generating component 7.

Figure 2:
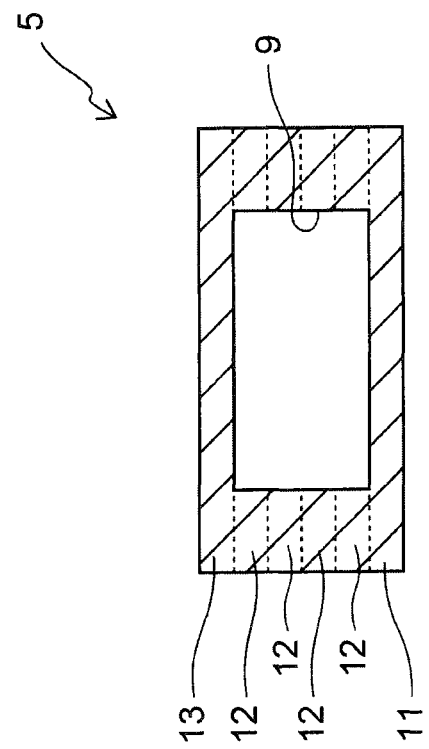
FIG. 2 is a cross-sectional view illustrating a vapor transport line, which is cut along a II-II line of FIG. 1.

FIG. 2 is a cross-sectional view illustrating the vapor transport line 5, which is cut along a II-II line of FIG. 1.

As illustrated in FIG. 2, in this example, a first surface metal layer 11, a plurality of intermediate metal layers 12, and a second surface metal layer 13 that are stacked in this order are bonded together to internally form a flow passage 9.

The loop heat pipe 1, which is formed by stacking such thin metal layers 11 to 13, enables thinning of the loop heat pipe 1, thereby facilitating thinning of the case 2.

In addition, metal such as copper exhibiting excellent thermal conductivity is used as a material for the metal layers 11 to 13. Accordingly, heat of the heat generating component 7 is rapidly propagated to the working fluid C inside the evaporator 3 to efficiently evaporate the working fluid C by heat of the heat generating component 7.

Figure 3:
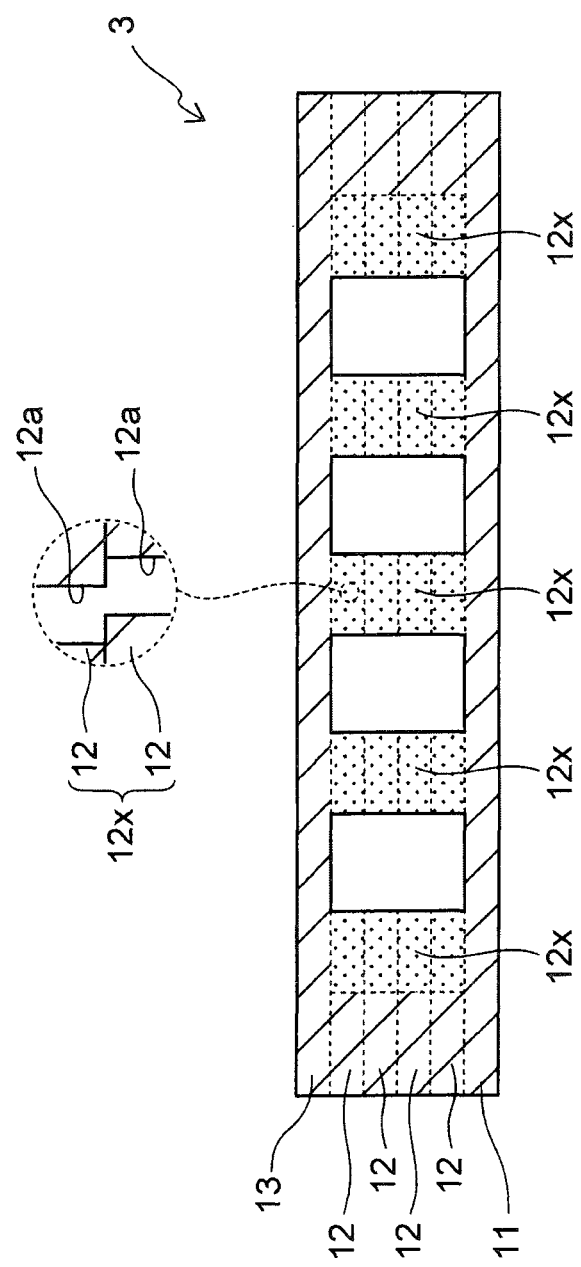
FIG. 3 is a cross-sectional view illustrating an evaporator, which is cut along a III-III line of FIG. 1.

FIG. 3 is a cross-sectional view illustrating the evaporator 3, which is cut along a line III-III of FIG. 1.

As illustrated in FIG. 3, of the evaporator 3, each of the intermediate metal layers 12 includes a plurality of pores 12a, so that a porous body 12x is formed by stacking the intermediate metal layers 12. The pores 12a of the porous body 12x communicate with each other three dimensionally, so that a liquid phase working fluid C permeates through each of the pores 12a of the porous body 12x. When the working fluid C permeates the porous body 12x in this manner, a capillary force is generated from each of the pores 12a to the working fluid C. The generated capillary forces thus act as a driving source for circulating the working fluid C.

Figure 4:
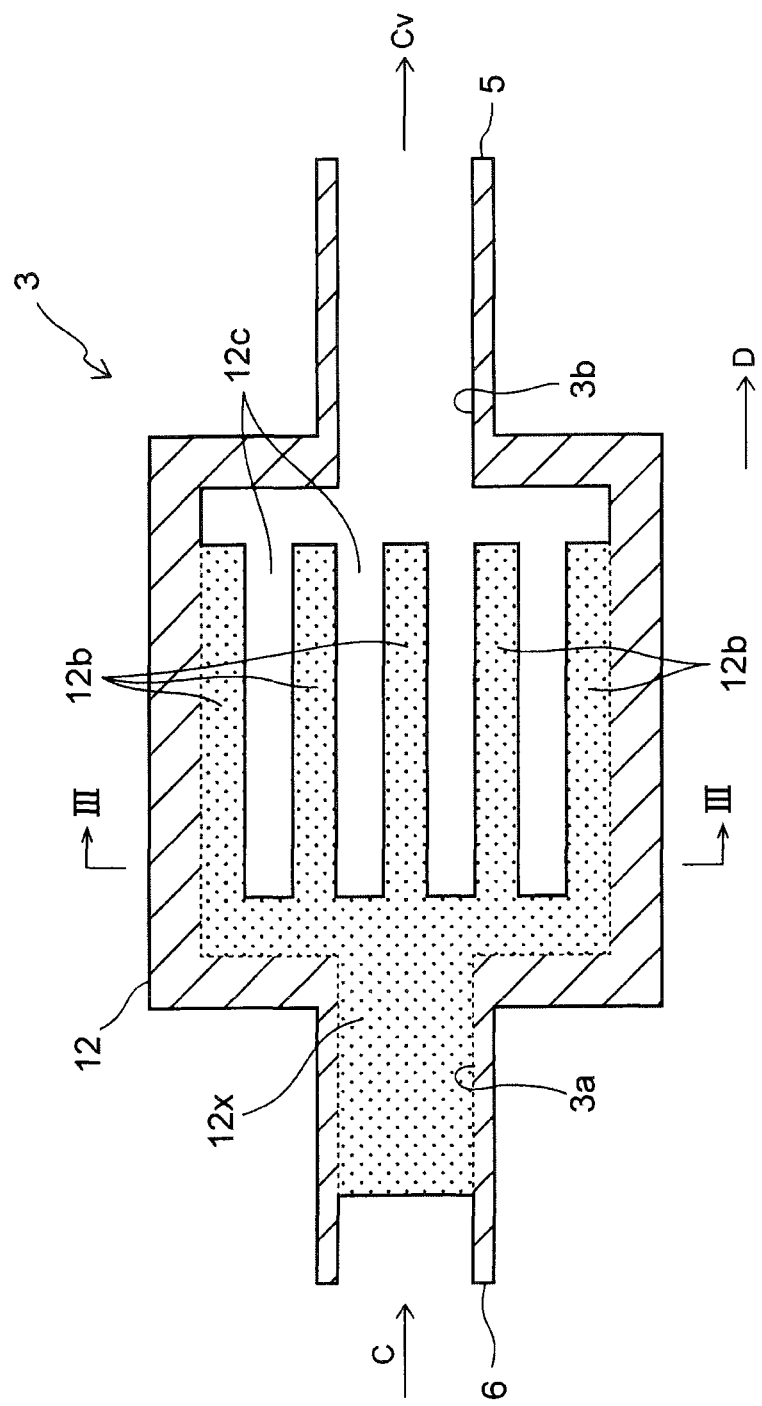
FIG. 4 is an enlarged plan view illustrating an intermediate metal layer of the evaporator of the loop heat pipe used in the related art review.

FIG. 4 is an enlarged plan view illustrating the intermediate metal layer 12 of the evaporator 3, and the aforementioned FIG. 3 corresponds to a cross-sectional view, which is cut along a line III-III of FIG. 4.

As illustrated in FIG. 4, the evaporator 3 includes a supply port 3a, to which a liquid phase working fluid C is supplied, and a discharge port 3b, from which vapor Cv is discharged. The porous body 12x has a comb-like shape having a plurality of comb-like teeth 12b extending along a direction D from the supply port 3a to the discharge port 3b as illustrated in FIG. 4.

The porous body 12x formed in such a comb-like shape is enables to increase the surface area of the porous body 12x, so that a greater amount of vapor Cv is generated from the porous body 12x. In addition, grooves 12c are each formed between adjacent comb-like teeth 12b, so that vapor Cv flows along the grooves 12c. This configuration will facilitate discharging of vapor Cv into the discharge port 3b.

The above-described loop heat pipe 1 is enabled to reduce the thickness of the loop heat pipe 1 by stacking the thin metal layers 11 to 13; however, heat leakage occurs where heat inside the evaporator 3 flows into the liquid transport line 6. The heat leakage adversely affects the start-up time of the loop heat pipe 1. The start-up time of the loop heat pipe 1 indicates a time required from an input of heat into the evaporator 3 to a start of transporting heat.

Specifically, in this example, metal exhibiting excellent thermal conductivity is used as a material for the first surface metal layer 11 and the second surface metal layer 13. This allows heat leakage to easily occur due to the thermal conductivity of the surfaces of the loop heat pipe 1, thereby drastically degrading the heat transport performance of the loop heat pipe 1.

The following describes one or more embodiments of the present invention, which are enabled to improve the heat transport performance of the loop heat pipe.

First Embodiment

Figure 5:
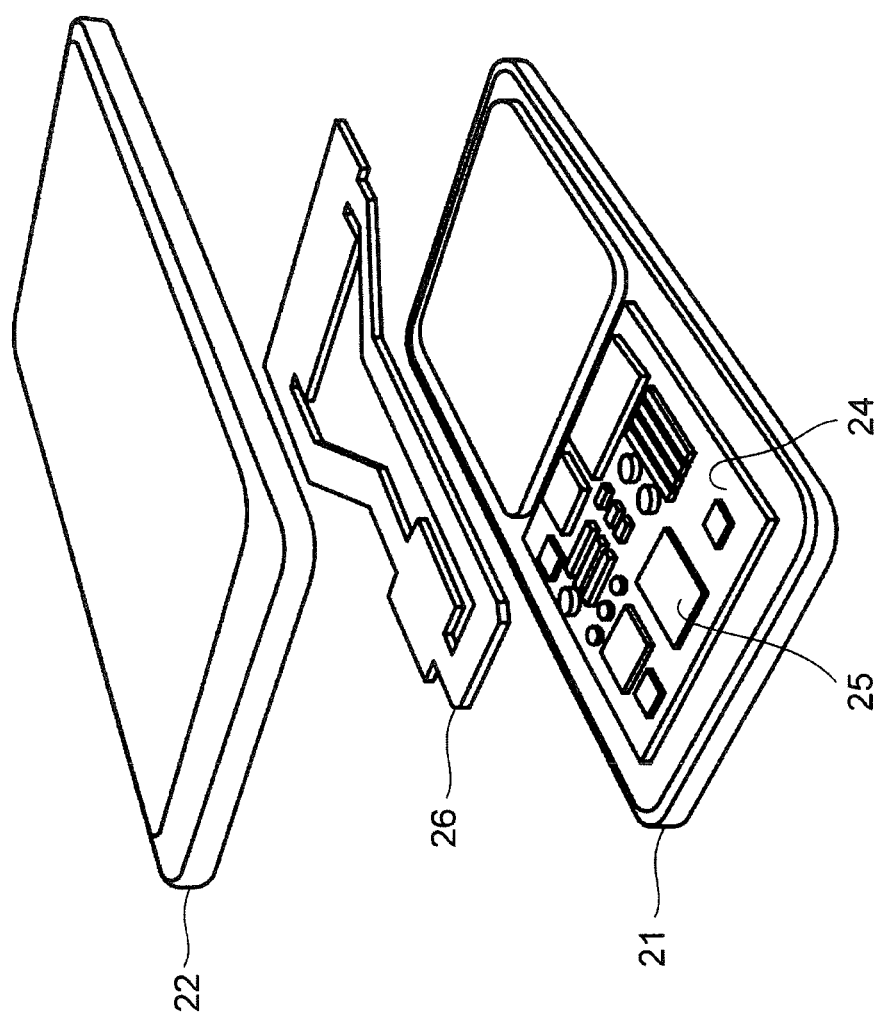
FIG. 5 is an exploded perspective view illustrating an electronic device according to a first embodiment.

FIG. 5 is an exploded perspective view of an electronic device 20 according to a first embodiment.

The electronic device 20 is an electronic mobile device, such as a smartphone. The electronic device 20 includes a rear cover 21 and a front cover 22.

The rear cover 21 and the front cover 22 are removable from each other, and a circuit board 24 and a loop heat pipe 26 are disposed between the rear cover 21 and the front cover 22. A heat generating component 25 such as a CPU is attached to the circuit board 24 so that heat of the heat generating component 25 is transferred by the loop heat pipe 26.

Figure 6:
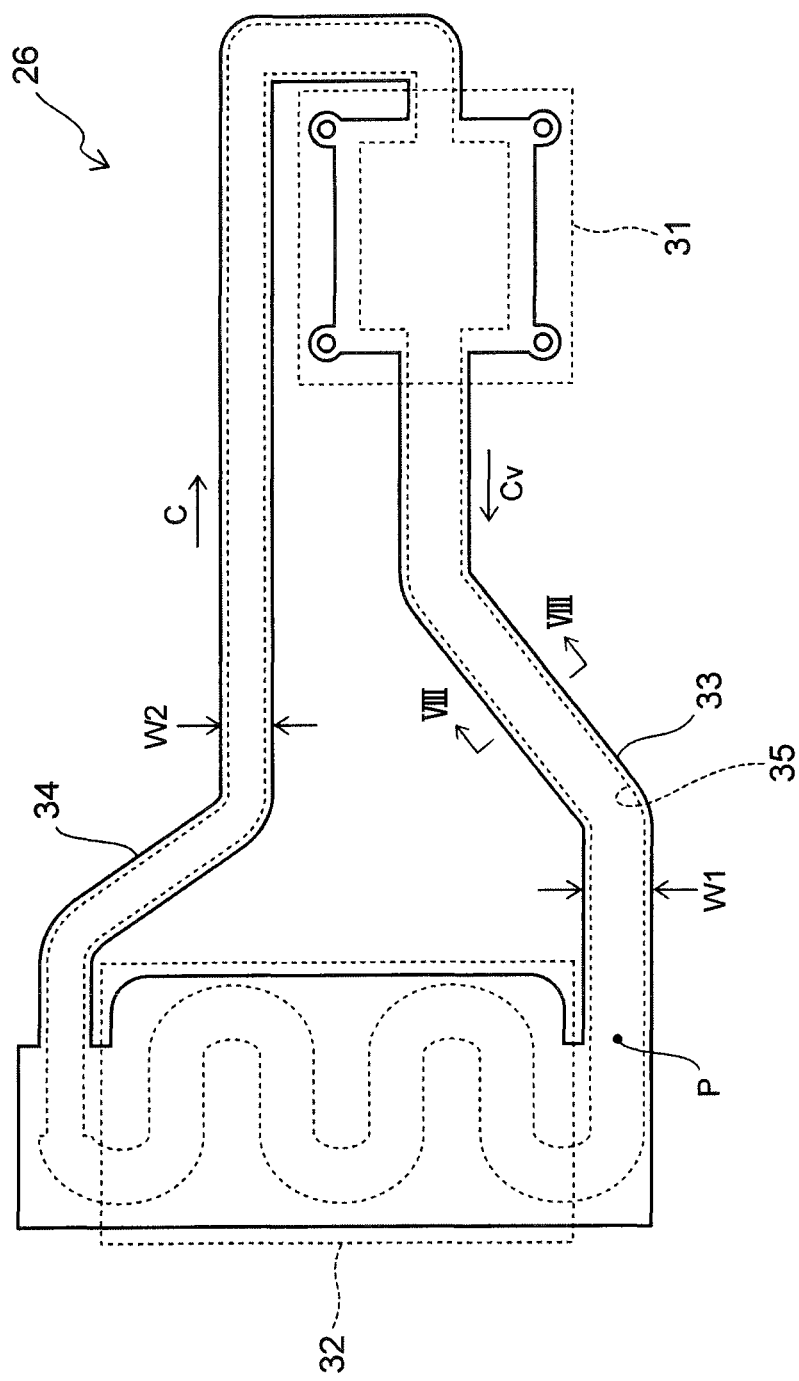
FIG. 6 is a plan view illustrating a loop heat pipe according to the first embodiment.

FIG. 6 is a plan view illustrating the loop heat pipe 26.

As illustrated in FIG. 6, the loop heat pipe 26 includes an evaporator 31 configured to evaporate a working fluid C to generate vapor Cv of the working fluid C, and a condenser 32 configured to liquefy the evaporated working fluid C. Each of the evaporator 31 and the condenser 32 is connected to a vapor transport line 33 and to a liquid transport line 34 such that the vapor transport line 33 and the liquid transport line 34 form a loop-like flow passage 35. Accordingly, the working fluid C flows through the loop-like flow passage 35.

Of the loop-like flow passage 35, the vapor transport line 33 transports a flow of a gas phase working fluid C (i.e., vapor Cv), and the liquid transport line 34 transports a flow of a liquid phase working fluid C.

The dimensions of the loop heat pipe 26 in FIG. 6 are not particularly specified; however, in this example, a width W1 of the vapor transport line 33 is approximately 8 mm, and a width W2 of the liquid transport line 34 is approximately 6 mm.

Figure 7:
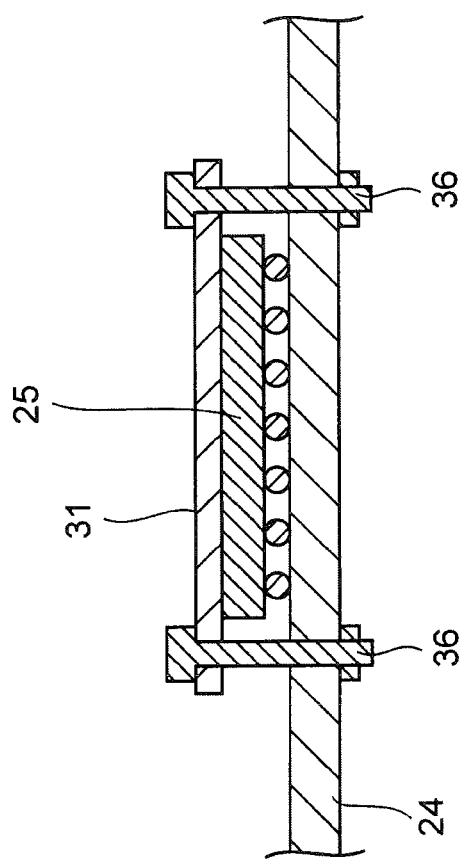
FIG. 7 is a cross-sectional view illustrating an evaporator according to the first embodiment and its perimeter.

FIG. 7 is a cross-sectional view illustrating the evaporator 31 and its perimeter.

As illustrated in FIG. 7, the evaporator 31 is secured to the circuit board 24 by screws 36. This configuration enables a surface of the heat generating component 25 to adhere closely to the evaporator 31 so that the working fluid C inside the evaporator 31 is vaporized by heat generated from the heat generating component 25.

A type of working fluid C is not particularly specified; however, water is used as a working fluid C in this embodiment. Alternatively, ammonia, chlorofluorocarbons, alcohols, and acetone may also be used as the working fluid C.

Figure 8:
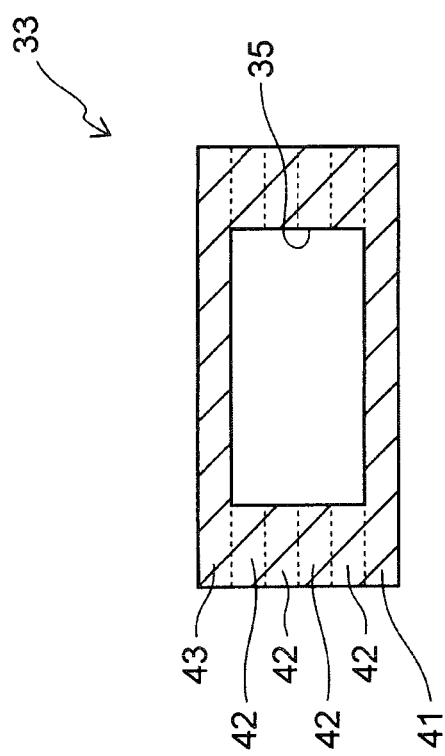
FIG. 8 is a cross-sectional view illustrating a vapor transport line, which is cut along a VIII-VIII line of FIG. 6.

FIG. 8 is a cross-sectional view illustrating the vapor transport line 33, which is cut along a VIII-VIII line of FIG. 6.

As illustrated in FIG. 8, the vapor transport line 33 is formed by stacking a first surface metal layer 41, a plurality of intermediate metal layers 42, and a second surface metal layer 43. These metal layers 41 to 43 thus define the loop-like flow passage 35.

The metal layers 41 to 43 may, for example, each be a copper layer having excellent thermal conductivity, so that the metal layers 41 to 43 are bonded together by diffusion bonding. The thickness of each of the metal layers 41 to 43 is approximately 0.1 mm to 0.3 mm. Accordingly, the overall thickness of a combination of the metal layers 41 to 43 is approximately 0.6 mm, thereby facilitating thinning of the electronic device 20.

Note that a stainless-steel layer, a magnesium alloy layer, or the like may be used as the metal layers 41 to 43, instead of the copper layer. However, it is preferable that all the metal layers 41 to 43 be the same material so that the metal layers 41 to 43 are bonded to each other well by diffusion bonding.

Further, in this example, a stacking number of intermediate metal layers 42 is four. However, the stacking number of intermediate metal layers 42 may be three or less, or five or more.

The evaporator 31, the condenser 32, and the liquid transport line 34 are also formed by stacking the metal layers 41 to 43 in the above-described manner.

Figure 9:
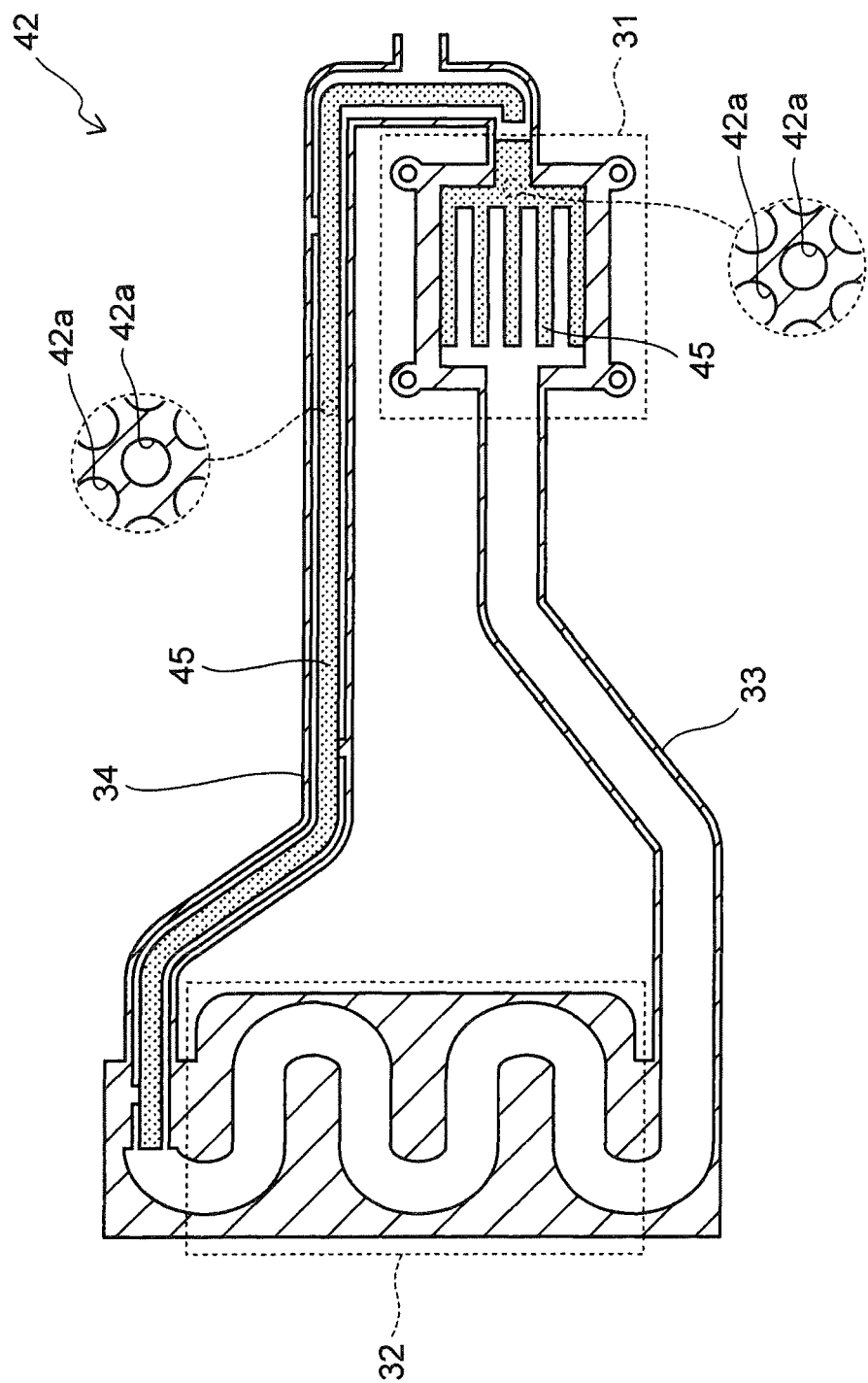
FIG. 9 is a plan view illustrating stacked intermediate metal layers according to the first embodiment.

FIG. 9 is a plan view illustrating stacked intermediate metal layers 42.

As illustrated in FIG. 9, the evaporator 31 and the liquid transport line 34 each include a porous body 45, which is formed by stacking a portion of the intermediate metal layers 42 each provided with a plurality of pores 42a.

Figure 10:
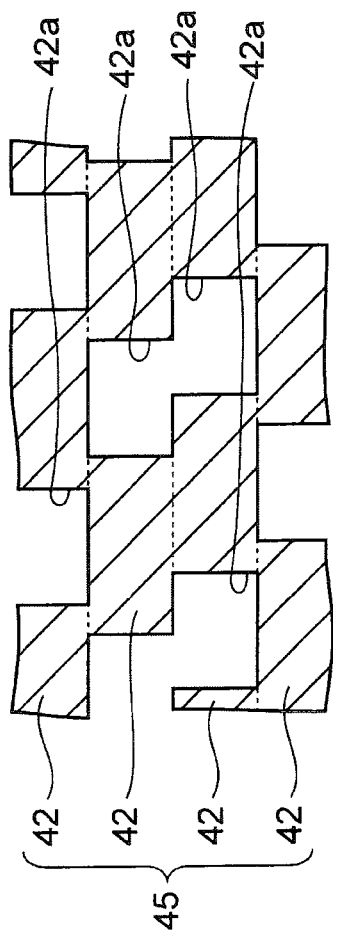
FIG. 10 is an enlarged cross-sectional view illustrating a porous body according to the first embodiment.

FIG. 10 is an enlarged cross-sectional view illustrating a porous body 45.

As illustrated in FIG. 10, adjacent upper and lower pores 42a of the porous body 45 communicate with each other, so that a working fluid C permeates through each of the pores 42a. In this configuration, upon permeating of the working fluid C, a capillary force is generated from each of the pores 42a with respect to the working fluid C. Thus, the generated capillary forces act as a driving source for circulating the working fluid C inside the loop heat pipe 26.

Figure 11:
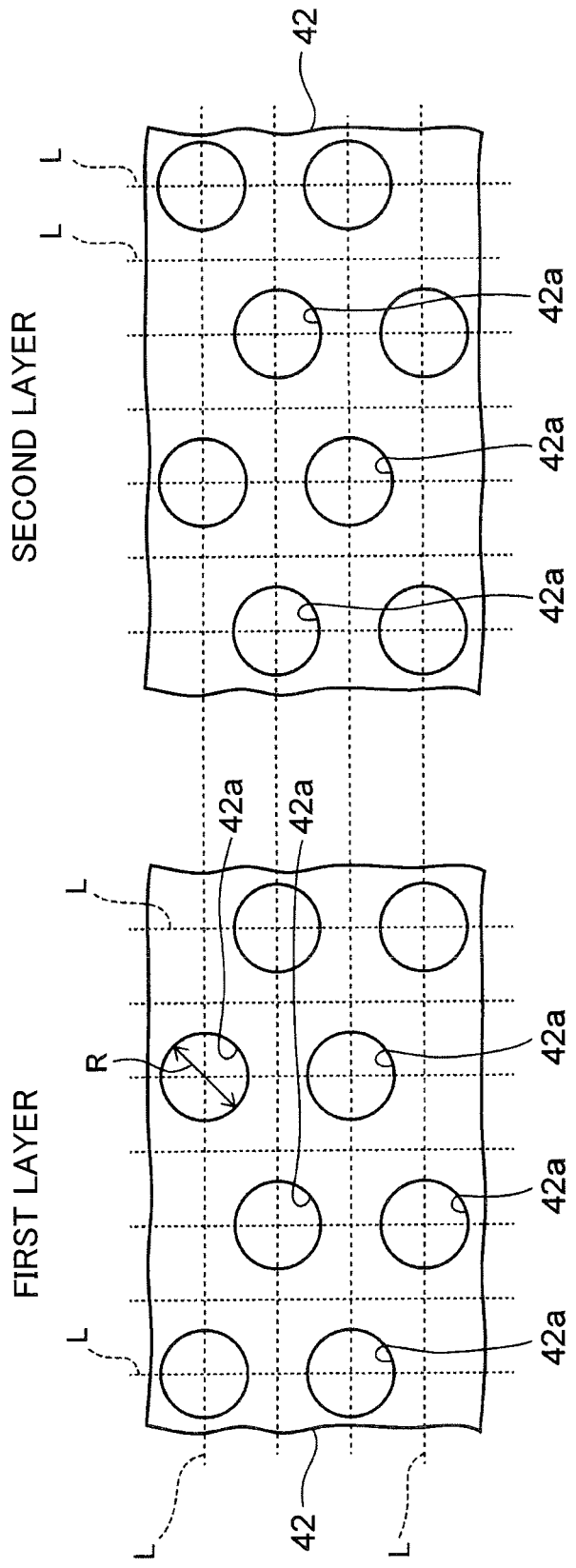
FIG. 11 indicates plan views illustrating pores of a first intermediate metal layer and pores of a second intermediate metal layer, according to the first embodiment.

FIG. 11 indicates plan views illustrating pores 42a of a first intermediate metal layer 42 and pores 42a of a second intermediate metal layer 42.

In the examples of FIG. 11, the pores 42a have a circular shape, and are disposed at intersections of a plurality of virtual straight lines L that are orthogonal to each other. Note that the pore 42a may be formed in any shape such as an ellipse or a polygon.

Further, a diameter R of each of the pores 42a is not particularly specified insofar as the working fluid C is able to permeate the porous body by capillary forces. The processing dimensions of the pores 42a may vary with the thickness of the metal layers 41 to 43; however, the diameter R may, for example, be approximately 0.2 mm in a case of a metal layer having a thickness of approximately 0.1 mm.

Further, the positions of the pores 42a differ between the first to the fourth intermediate metal layers 42.

Figure 12:
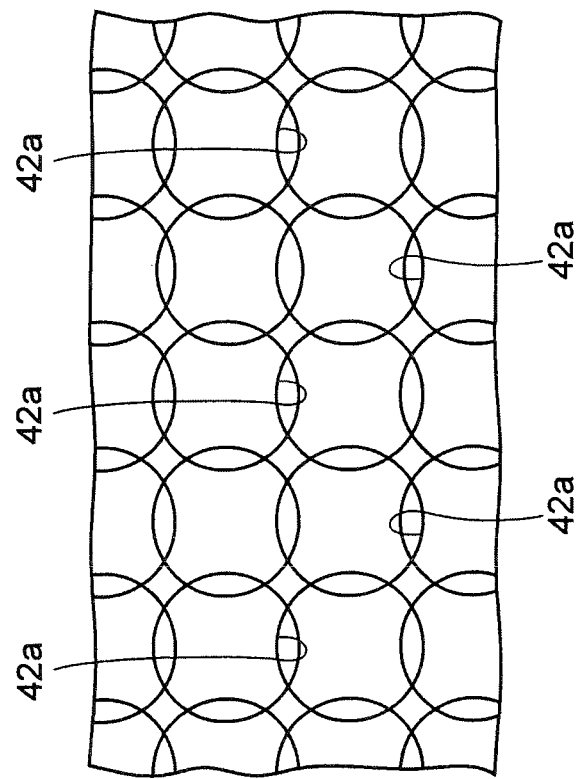
FIG. 12 is a plan view schematically illustrating positions of respective pores according to the first embodiment.

FIG. 12 is a plan view schematically illustrating respective positions of the pores 42a when four intermediate metal layers 42 are stacked.

As described above, the pores 42a are positioned differently between the four (the first to the fourth) intermediate metal layers 42, so that the pores 42a of the stacked four intermediate metal layers 42 partially overlap each other in a plan view.

Figure 13:
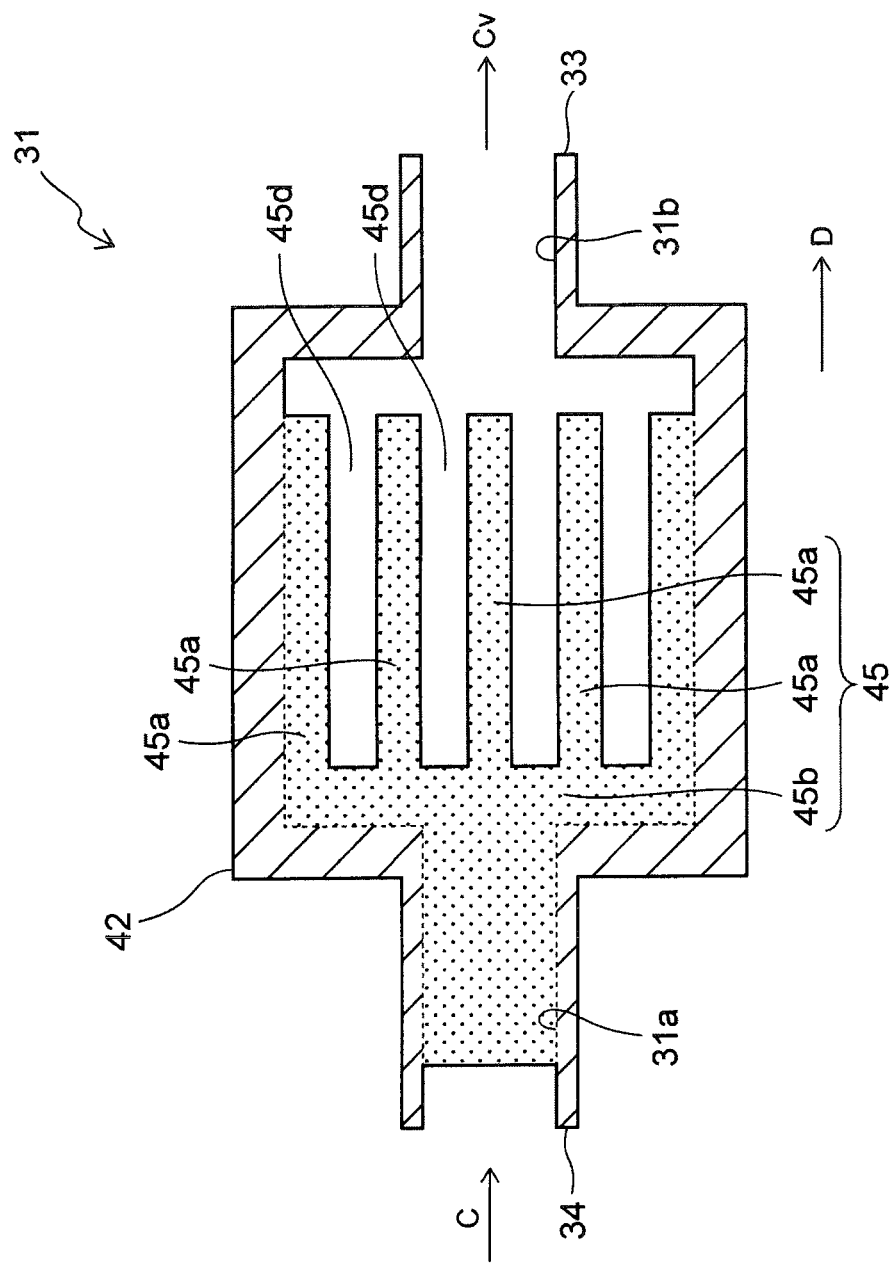
FIG. 13 is an enlarged plan view illustrating the intermediate metal layer of the evaporator according to the first embodiment.

FIG. 13 is an enlarged plan view illustrating the intermediate metal layers 42 disposed in the evaporator 31.

As illustrated in FIG. 13, the evaporator 31 has a supply port 31a, to which a liquid phase working fluid C is supplied, and a discharge port 31b, from which vapor Cv is discharged.

The porous body 45 has a comb-like shape having a plurality of comb-like teeth 45a extending along a direction D from the supply port 31a to the discharge port 31b, and a coupling portion 45b for coupling respective ends of the comb-like teeth 45a at the supply port 31a side in FIG. 13. Grooves 45d are each formed in a space between adjacent comb-like teeth 45a so as to discharge vapor Cv from the comb-like teeth 45a.

According to this configuration, a liquid phase working fluid C supplied from the supply port 31a infiltrates the porous body 45, and the infiltration of the liquid phase working fluid C gradually progress toward respective tips of the comb-like teeth 45a by capillary forces generated from the pores 42a (see FIG. 10). The working fluid C then evaporates by heat of the heat generating component 25 (see FIG. 7), and vapor Cv is discharged from the plurality of comb-like teeth 45a to the respective grooves 45d.

The grooves 45d extend along a direction D (see FIG. 13) so that vapor Cv is enabled to be smoothly discharged toward the discharge port 31b.

Figure 14:
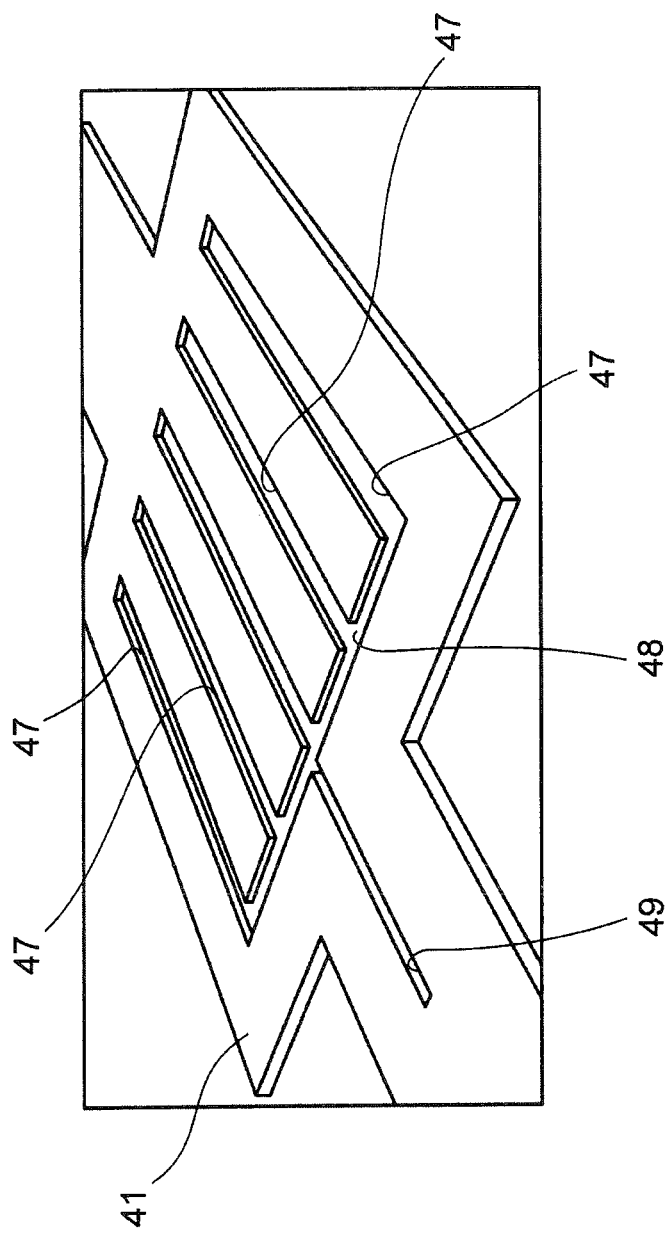
FIG. 14 is an enlarged perspective view illustrating a first surface metal layer of the evaporator according to the first embodiment.

FIG. 14 is an enlarged perspective view illustrating a first surface metal layer 41 of the evaporator 31.

As illustrated in FIG. 14, the first surface metal layer 41 includes a plurality of comb-like grooves 47 and a coupling groove 48 configured to couple the comb-like grooves 47. The coupling groove 48 is coupled to an extended groove 49 extending toward the liquid transport line 34 (see FIG. 15).

Figure 15:
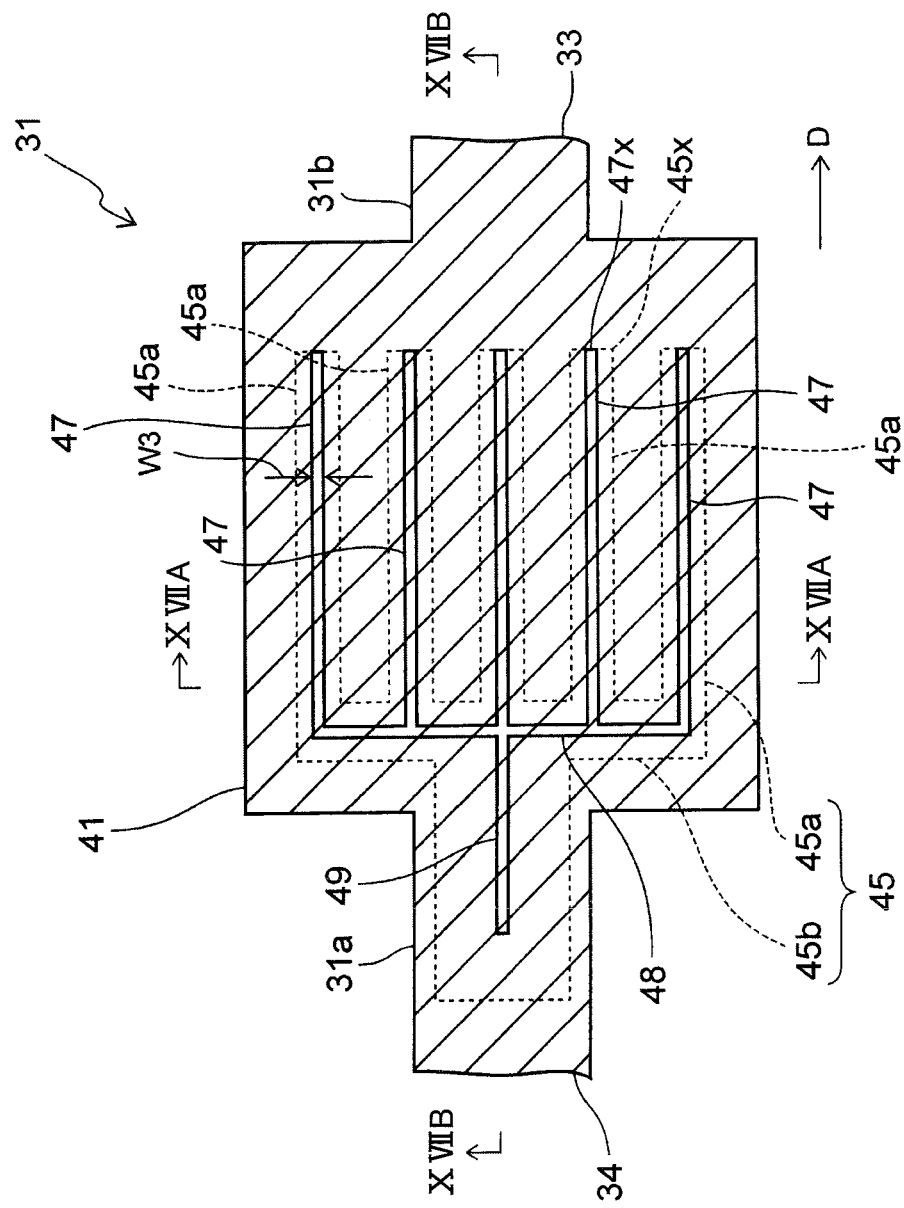
FIG. 15 is an enlarged plan view illustrating the first surface metal layer of the evaporator according to the first embodiment.

FIG. 15 is an enlarged plan view illustrating the first surface metal layer 41 of the evaporator 31. Note that the second surface metal layer 43 of the evaporator 31 has a planar shape the same as a planar shape of the first surface metal layer 41, and the description thereof will not be repeated.

As illustrated in FIG. 15, a plurality of grooves 47 is disposed to respectively overlap a plurality of comb-like teeth 45a of the porous body 45. The plurality of grooves 47 extends along a direction D from the supply port 31a toward the discharge port 31b.

The coupling groove 48 is also disposed to overlap the coupling portion 45b of the porous body 45. The coupling groove 48 functions to distribute the liquid phase working fluid C supplied from the extended groove 49 to the plurality of grooves 47.

Thus, when compared with an evaporator 31 without having the comb-like grooves 47 where the working fluid C is caused to infiltrate the porous body 45 by solely using the capillary forces of the porous body 45, the evaporator 31 having the comb-like grooves 47 is enabled to cause the liquid phase working fluid C supplied from the supply port 31a to pass along the comb-like grooves 47 to more rapidly reach the tips of the comb-like teeth 45a. As a result, vapor Cv of the working fluid C is generated from the comb-like teeth 45a immediately after heat is produced by the heat generating component 25, and the generated vapor Cv is discharged from the plurality of comb-like teeth 45a to the respective grooves 47. The vapor Cv thus rapidly reaches the discharge port 31b so as to reduce the start-up time of the loop heat pipe 26.

Specifically, the coupling groove 48 is formed in this manner to couple the plurality of grooves 47. This enables the liquid phase working fluid C to reach all the grooves 47 via the coupling groove 48.

A width W3 of each groove 47 is not particularly specified. However, if the width W3 of each groove 47 is smaller than the diameter R of each pore 42a (see FIG. 11), the working fluid C must only use the capillary forces of the pores 42a to infiltrate the porous body 45. This indicates that the grooves 47 would not be able to assist the working fluid C to infiltrate the porous body 45.

Accordingly, in this example, the width W3 of each groove 47 is made to be approximately 0.5 mm, such that the width W3 of the groove 47 is larger than the diameter R (approximately 0.2 mm) of the pore 42a. Such a configuration will facilitate flowing of the working fluid C more easily in the grooves 47 than in the pores 42a, enabling the grooves 47 to assist the working fluid C to infiltrate the porous body 45.

The depth of each groove 47 is not particularly specified, and the grooves 47 may each be formed to have a depth of approximately 0.03 mm.

Further, the positions of tips 47x of the grooves 47 are not particularly specified. However, the respective tips 47x of the grooves 47 may preferably extend to the respective tips 45x of the comb-like teeth 45a such that the positions of the tips 45x match the positions of the tips 47x. This configuration enables the liquid phase working fluid C to be quickly supplied to the tips 45x of the comb-like teeth 45a via the grooves 47, thereby enabling the vapor Cv to be generated from the entirety of the comb-like teeth 45a.

Alternatively, the tips 47x of the grooves 47 may be made to slightly protrude from the tips 45x of the comb-like teeth 45a without precisely matching the positions of the tips 45x so as to supply the working fluid C via the grooves 47 to the tips 45x of the comb-like teeth 45a.

However, if the grooves 47 are made to extend to the liquid transport line 34, the vapor Cv generated inside the evaporator 31 would flow back via the grooves 47 to be discharged to the liquid transport line 34. This will prevent the working fluid C from circulating in one direction inside the loop heat pipe 26.

In view of the above, the porous body 45 is preferably interposed between the liquid transport line 34 and the grooves 47 as illustrated in FIG. 15 in order to prevent backflow of the vapor Cv by using water of the liquid phase working fluid C contained in the porous body 45.

Although the extended groove 49 is formed as illustrated in the example of FIG. 15, the extended groove 49 may be omitted in order to effectively prevent backflow of vapor Cv.

Figure 16:
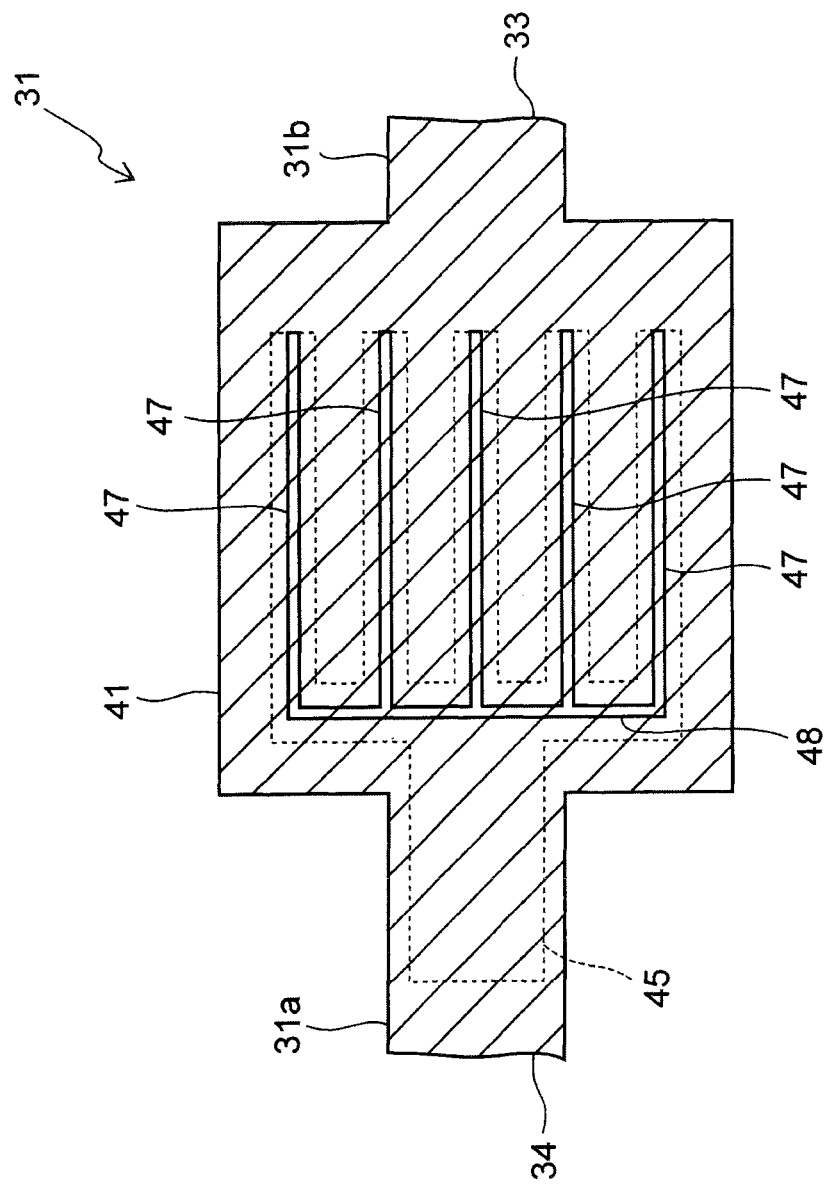
FIG. 16 is an enlarged plan view illustrating the first surface metal layer of the evaporator according to the first embodiment, from which an extended groove is omitted.

FIG. 16 is an enlarged plan view illustrating the first surface metal layer 41 of the evaporator 31, from which the extended groove 49 is omitted. This configuration eliminates the extended groove 49 in order to prevent the vapor Cv inside the evaporator 31 from flowing back into the liquid transport line 34 through the extended groove 49.

FIG. 17A is a cross-sectional view illustrating the evaporator 31, which is cut along a XVIIA-XVIIA line of FIG. 15. FIG. 17B is a cross-sectional view illustrating the evaporator 31, which is cut along a XVIIB-XVIIB line of FIG. 15.

As illustrated in FIGS. 17A and 17B, the evaporator 31 includes a first inner surface 41a and a second inner surface 43a that mutually face each other. Of these, the first inner surface 41a is defined by a surface of the first surface metal layer 41 and the second inner surface 43a is defined by a surface of the second surface metal layer 43.

The first inner surface 41a and the second inner surface 43a are each provided with a plurality of grooves 47. The first inner surface 41a and the second inner surface 43a are further provided with comb-like teeth 45a of the porous body 45 that closely adhere to each of the first inner surface 41a and the second inner surface 43a.

The inventors of the present application have studied how the heat transport performance of the loop heat pipe 26 is improved by forming the grooves 47 on the evaporator 31 as illustrated in the present embodiment.

Figure 18:
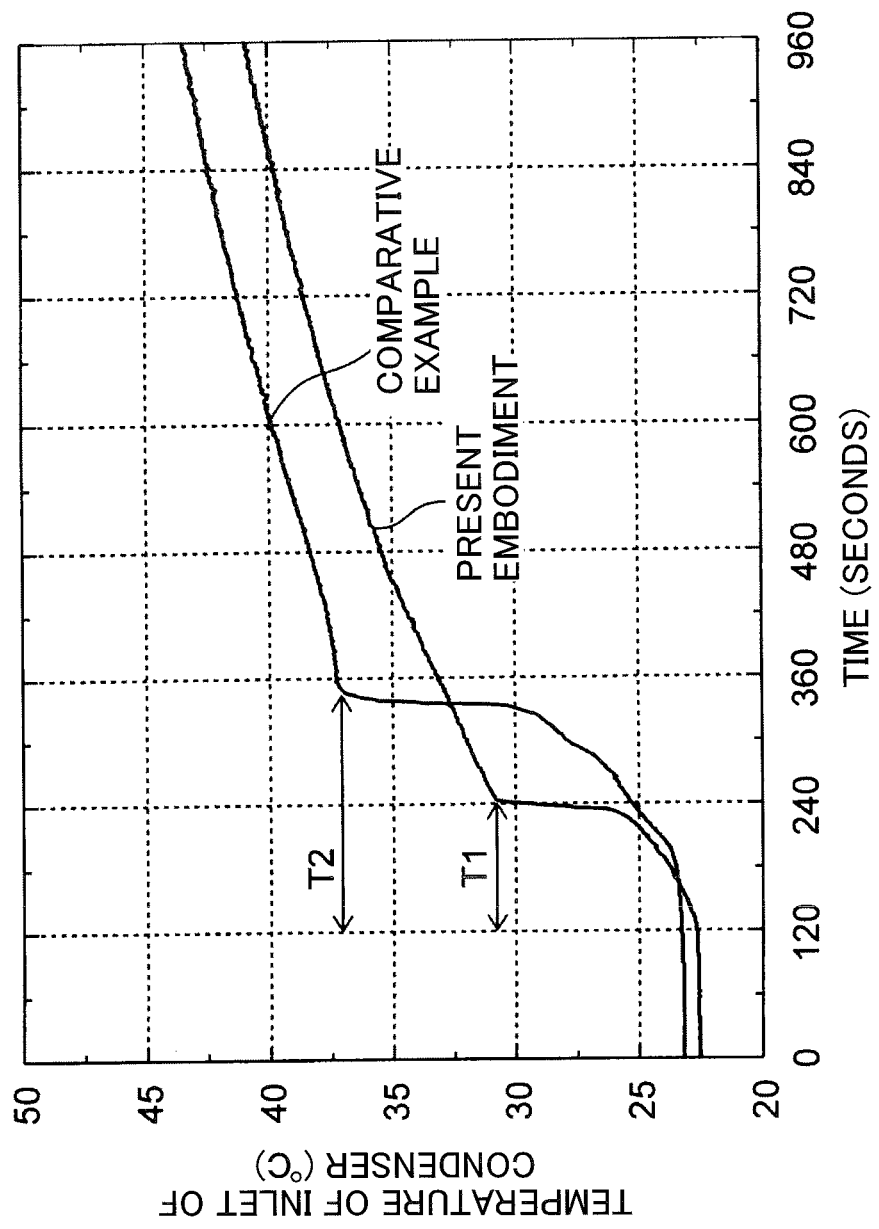
FIG. 18 is a graph obtained by studying how the temperature of an inlet of a condenser changes over time after heat is input to the evaporator according to the first embodiment.

The results of the study are illustrated in FIG. 18.

FIG. 18 is a graph obtained by studying how the temperature of an inlet P (see FIG. 6) of the condenser 32 varies over time after applying heat to the evaporator 31. The time required to input heat to the evaporator 31 was set to 120 seconds.

In addition, in this study, a loop heat pipe according to a comparative example was also prepared by not forming the grooves 47 on each of the surfaces 41a and 43a, and the same study (as in the present embodiment) was conducted on the loop heat pipe made according to the comparative example.

The results illustrated in FIG. 18 are as follows. In the comparative example, a time T2 was required until the slope of the graph became substantially constant. This was obtained when vapor generated by the evaporator 31 that had passed through the vapor transport line reached the inlet P of the condenser 32. By contrast, in the present embodiment, a shorter time T1 (i.e., T1 being shorter than the time T2) was required until the slope of the graph became substantially constant. These results indicate that the loop heat pipe 26 according to the present embodiment was activated earlier than the loop heat pipe according to the comparative example. This is because, as described above, in the present embodiment, forming of the grooves 47 caused the working fluid C to quickly infiltrate the porous body 45, so that the start-up time until vapor Cv was generated from the entire porous body 45 was earlier than the start-up time of the comparative example.

Further, the above-described results clearly indicate that when temperatures of the evaporator 31 according to the present embodiment and the evaporator according to the comparative example were compared at the same time, the temperature of the evaporator 31 according to the present embodiment was lower than that of the evaporator according to the comparative example. This indicates that the temperature increase was prevented in the evaporator 31 according to the present embodiment.

The above-described results indicate that even when heat leakage occurred due to high thermal conductivity of the metal layers 41 to 43 in the present embodiment, it was still possible to accelerate the start-up time of the loop heat pipe 26 while preventing the temperature increase in the evaporator 31 by forming the grooves 47.

In present embodiment, as illustrated in FIGS. 17A and 17B, the grooves 47 are formed on both the first inner surface 41a and the second inner surface 43a; however, the present embodiment is not limited to this example.

Figure 19:
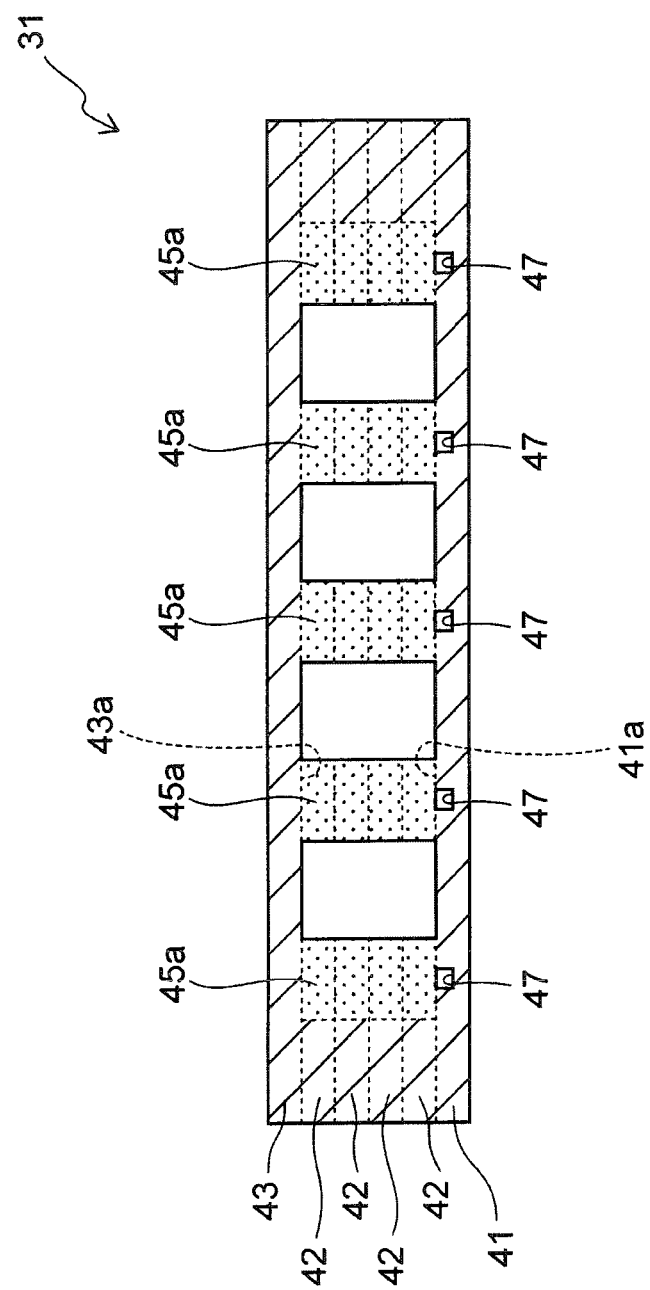
FIG. 19 is a cross-sectional view illustrating the evaporator according to the first embodiment where grooves are formed only on a first inner surface and no grooves are formed on a second inner surface.

FIG. 19 is a cross-sectional view illustrating the evaporator 31 where the grooves 47 are formed only on the first inner surface 41a and no grooves 47 are formed on the second inner surface 43a. As illustrated in this configuration, even if the grooves 47 are formed only on one of the inner surfaces 41a and 43a, it is still possible to improve the heat transport performance of the loop heat pipe 26, in the same manner as described above.

Next, a method of fabricating the loop heat pipe 26 according to the present embodiment will be described.

Figure 20:
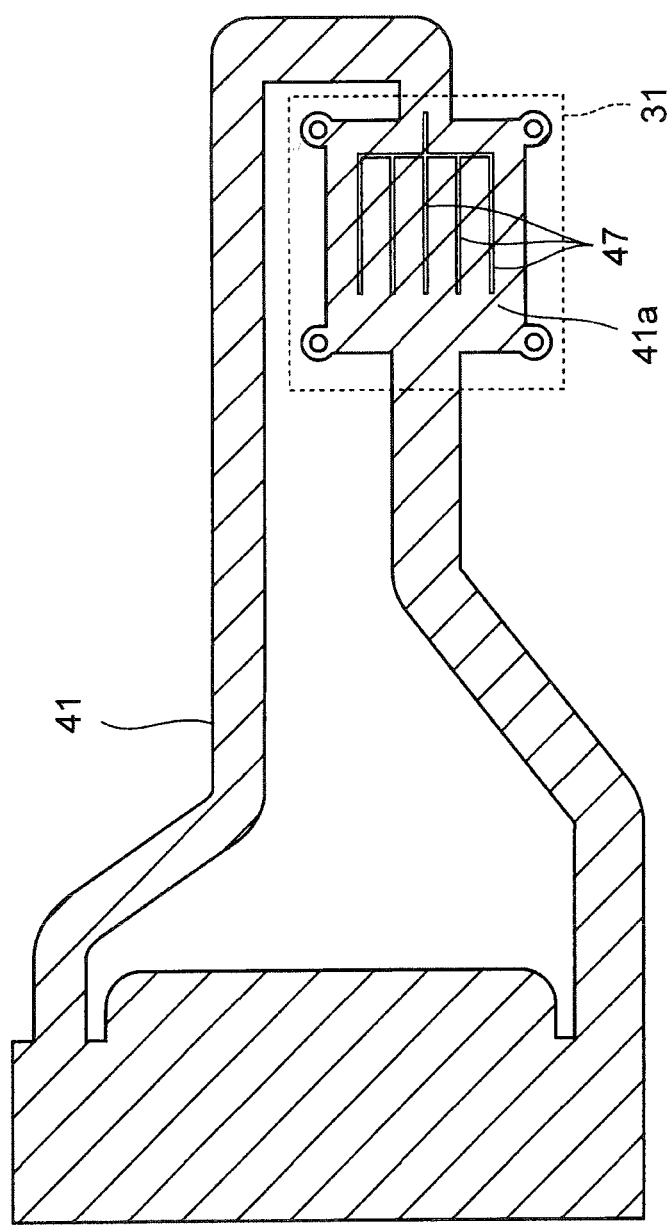
FIG. 20 is a plan view illustrating a first surface metal layer, which is used to fabricate the loop heat pipe according to the first embodiment.

FIG. 20 is a plan view illustrating a first surface metal layer 41, which is used to fabricate a loop heat pipe 26. Note that a planar shape of a second surface metal layer 43 is the same as that of the first surface metal layer 41, and the description thereof will not thus be repeated.

These surface metal layers 41 and 43 may each be formed, for example, by patterning an approximately 0.1 mm thick copper layer in a predetermined shape by wet etching.

In this embodiment, of the first inner surface 41a of the first surface metal layer 41, a portion corresponding to the evaporator 31 includes the aforementioned grooves 47 that are formed by half etching. In the half etching, a resist film (not illustrated) is masked to wet etch the first metal layer 41 to a depth of approximately 0.03 mm so as to form each groove 47 having a width of approximately 0.5 mm.

Similarly, the grooves 47 are formed on the second inner surface 42a of the second surface metal layer 43, as in the first inner surface of the first surface metal layer 41 (see FIG. 17A).

Figure 21:
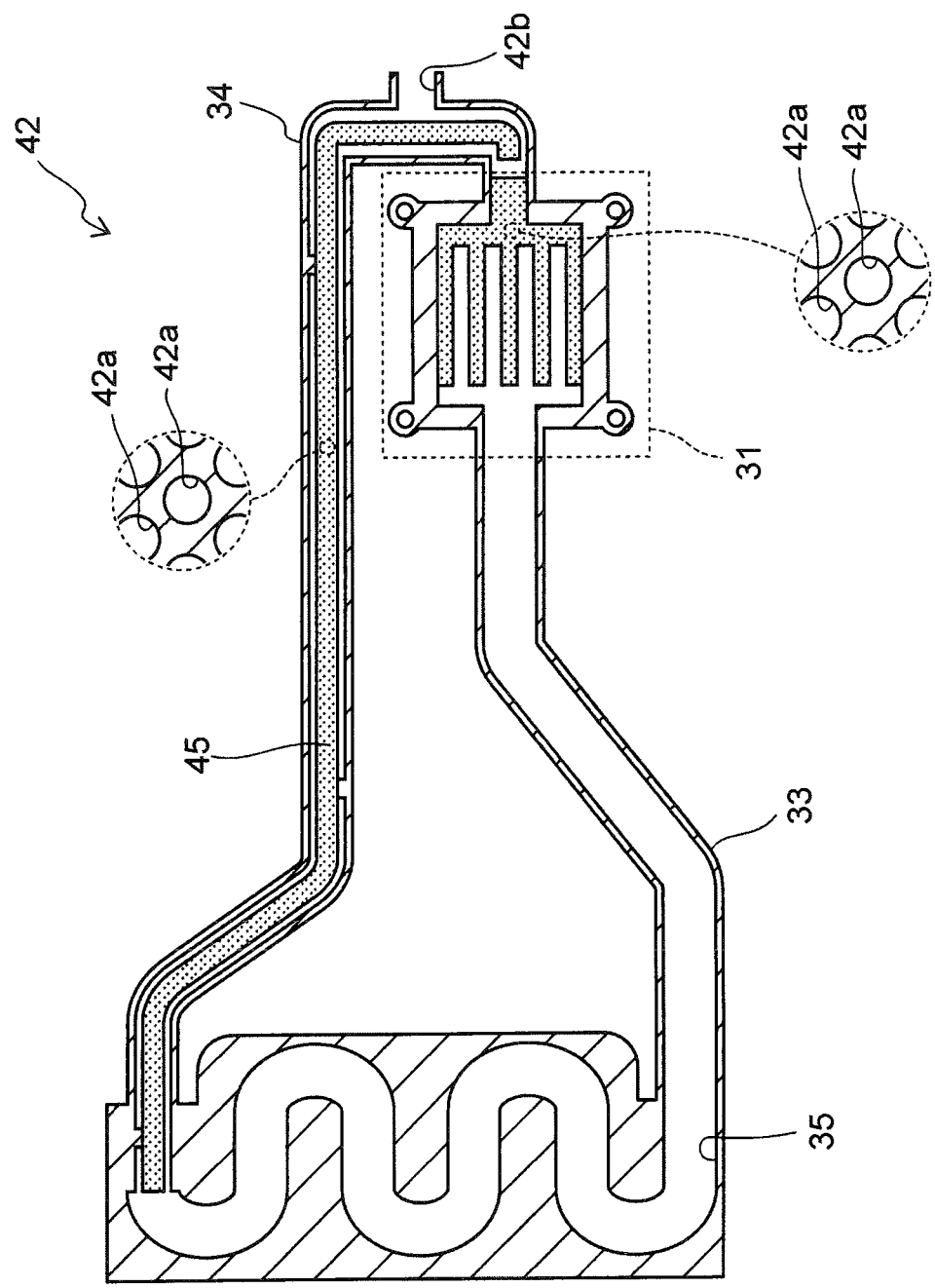
FIG. 21 is a plan view illustrating an intermediate metal layer, which is used to fabricate the loop heat pipe according to the first embodiment.

FIG. 21 is a plan view illustrating an intermediate metal layer 42, which is used to fabricate the loop heat pipe 26.

Similar to each of the surface metal layers 41 and 43 described above, the intermediate metal layer 42 is formed by patterning an approximately 0.1 mm thick copper layer in a predetermined shape by wet etching.

In the wet etching, a flow passage 35 is internally formed in the intermediate metal layers 42, and a plurality of pores 42a is formed in the intermediate metal layers 42 to form the porous body 45.

The intermediate metal layers 42 include a portion corresponding to the liquid transport line 34, and the liquid transport line 34 is provided with an inlet port 42b to inject the working fluid C.

The subsequent steps will be described with reference to FIGS. 22A and 22B.

Figures 22A, 22B:
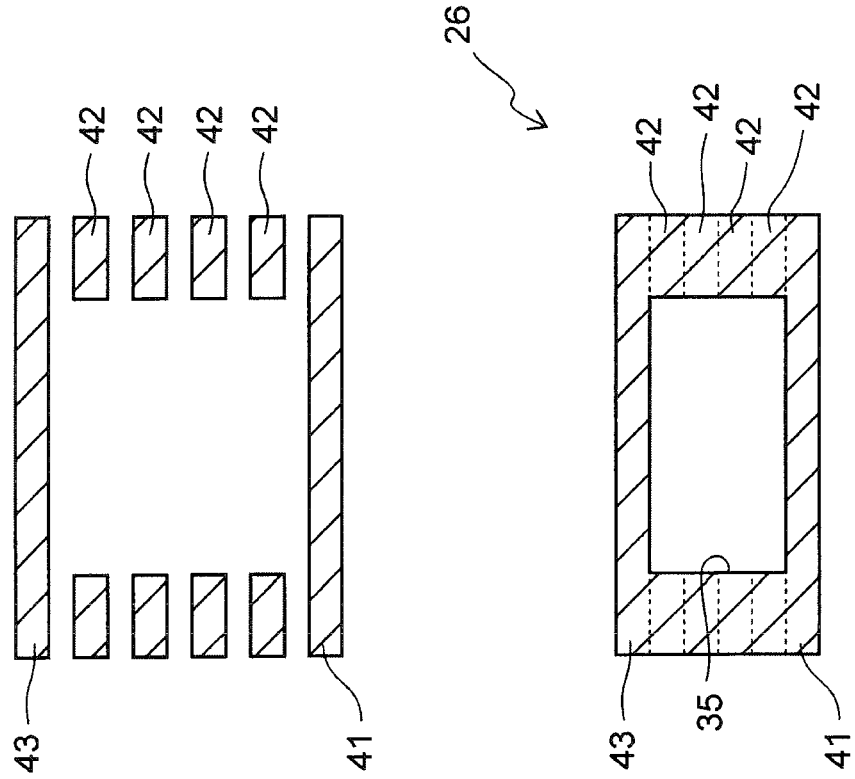
FIGS. 22A and 22B are cross-sectional views illustrating respective steps during a fabrication process of a loop heat pipe according to the first embodiment.

FIGS. 22A and 22B are cross-sectional views illustrating different steps of a loop heat pipe fabrication process in accordance with the present embodiment. Note that FIGS. 22A and 22B correspond to cross-sectional views of the vapor transport line 33 in the completed loop heat pipe 26.

First, as illustrated in FIG. 22A, a plurality of intermediate metal layers 42 is disposed between the first surface metal layer 41 and the second surface metal layer 43.

Next, as illustrated in FIG. 22B, the metal layers 41 to 43 are stacked. Then, the metal layers 41 to 43 are pressed together while heating the metal layers 41 to 43 to approximately 900° C., so that constituent metal of the metal layers 41 to 43 is mutually diffused. Thus, the metal layers 41 to 43 are bonded together by diffusion bonding, and the loop-like flow passage 35 is defined by the metal layers 41 to 43.

Subsequently, the liquid transport line 34 is internally vacuumed from the inlet port 42b (see FIG. 21) using a vacuum pump (not illustrated). Then, water is injected as the working fluid C into the liquid transport line 34 through the inlet port 42b, and the inlet port 42b is finally sealed.

As described above, the loop heat pipe 26 in accordance with the present embodiment is thus completed.

Second Embodiment

According to a second embodiment, a variation of a shape of the grooves 47 described in the first embodiment will be described.

Figure 23:
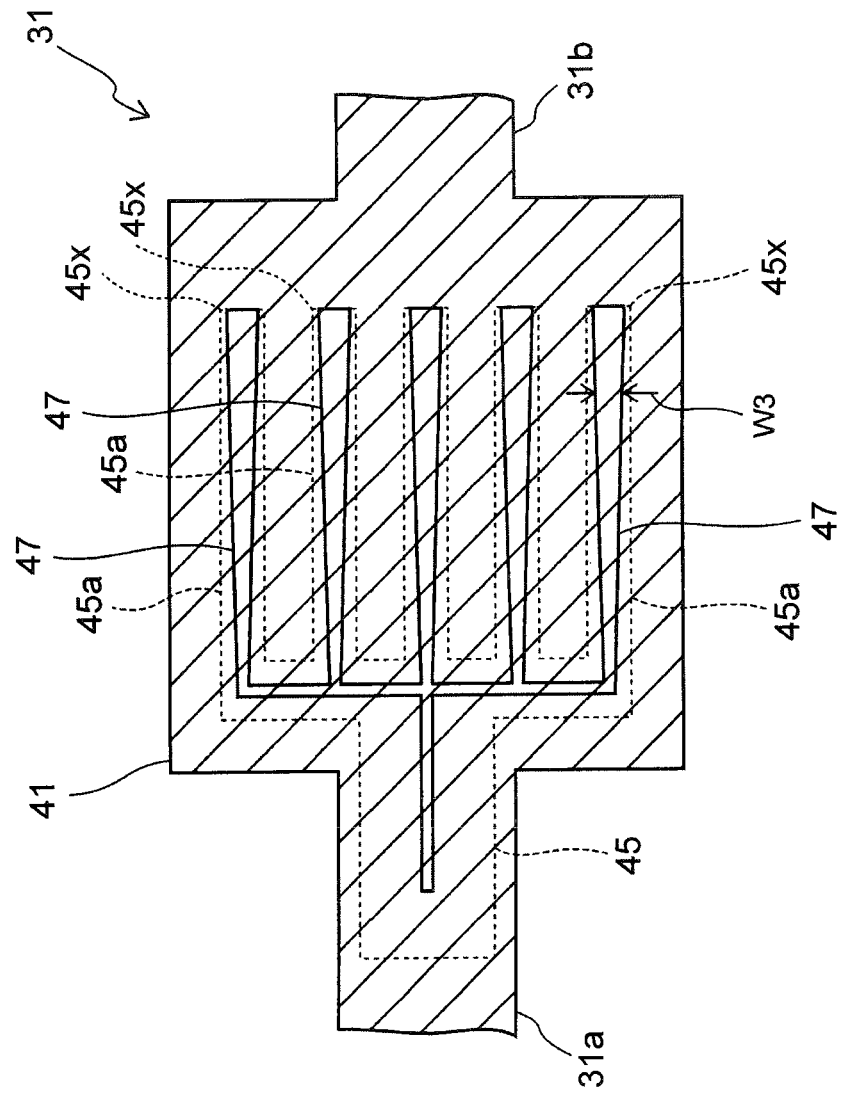
FIG. 23 is an enlarged plan view illustrating a first surface metal layer of an evaporator according to a second embodiment.

FIG. 23 is an enlarged plan view illustrating the first surface metal layer 41 of the evaporator 31 according to the present embodiment. Since an enlarged plan view of the second surface metal layer 43 is the same as FIG. 23, the description thereof will not be repeated. In FIG. 23, elements the same as those described in the first embodiment are provided with the same reference number, and the description thereof will not be repeated.

As illustrated in FIG. 23, an evaporator 31 according to the second embodiment includes a plurality of grooves 47, and a porous body 45 having a plurality of comb-like teeth 45a corresponding to the plurality of grooves 47. In this configuration, a width W3 of each groove 47 gradually broadens toward a corresponding one of the tips 45x of the comb-like teeth 45a of the porous body 45.

This configuration enables the working fluid C to easily flow along the grooves 47 toward the tips 45x of the comb-like teeth 45a of the porous body 45, thereby allowing the working fluid C to easily reach the tips 45x of the comb-like teeth 45a of the porous body 45.

Although respective embodiments have been described in detail above, the embodiments are not limited to the above-described examples.

For example, the dimensions of the loop heat pipe 26 in accordance with the embodiments may be appropriately optimized according to the required amount of heat to be transported and the distance required for transporting heat.

According to one aspect of embodiments, a loop heat pipe configured to quickly supply a working fluid to a porous body from grooves disposed on at least one of a first inner surface and a second inner surface of an evaporator is provided. The loop heat pipe having such a configuration exhibits a significantly improved heat transport performance.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that the various changes, substitutions, and alterations could be made hereto without departing from the spirit and scope of the invention.

What is claimed is:
1. A loop heat pipe comprising:
an evaporator configured to evaporate a liquid phase of a working fluid to generate vapor, the evaporator including a first inner surface and a second inner surface, the first inner surface and the second inner surface facing each other;
a comb-like porous body including a plurality of comb teeth in a plan view of the loop heat pipe, the comb-like porous body being disposed inside the evaporator;
a plurality of grooves disposed on at least one of the first inner surface or the second inner surface, such that the plurality of grooves respectively overlap the plurality of comb teeth in the plan view;
a vapor transport line configured to transport the vapor of the working fluid;
a condenser configured to liquefy the vapor of the working fluid; and
a liquid transport line configured to transport the liquefied vapor as the liquid phase of the working fluid,
wherein each of the liquid transport line and the vapor transport line connects the evaporator and the condenser, such that the vapor transport line and the liquid transport line form a loop-like flow passage.
2. The loop heat pipe as claimed in claim 1, wherein the evaporator includes:
a supply port to which the liquid phase of the working fluid is supplied, and
a discharge port from which the vapor of the working fluid is discharged,
wherein the plurality of comb teeth extends along a direction from the supply port toward the discharge port.
3. The loop heat pipe as claimed in claim 2, further comprising:
a coupling groove configured to connect the plurality of grooves, the coupling groove being disposed on at least one of the first inner surface or the second inner surface at a position proximate to the supply port.
4. The loop heat pipe as claimed in claim 1, wherein the plurality of grooves extends to respective tips of the plurality of comb teeth.
5. The loop heat pipe as claimed in claim 1, wherein the porous body is interposed between the liquid transport line and the plurality of grooves in the plan view.
6. The loop heat pipe as claimed in claim 1, wherein a width of each of the plurality of grooves increases toward a corresponding one of the tips of the plurality of comb teeth.
7. The loop heat pipe as claimed in claim 1,
wherein the evaporator, the condenser, the liquid transport line, and the vapor transport line are each formed by stacking a first surface metal layer, a plurality of intermediate metal layers, and a second surface metal layer in this order, and
wherein the porous body corresponds to a portion of the stacked intermediate metal layers each provided with a plurality of pores.
8. The loop heat pipe as claimed in claim 7, wherein a diameter of each of the pores is less than a width of each groove.
9. An electronic device comprising:
a heat generating component,
a loop heat pipe configured to cool the heat generating component, wherein the loop heat pipe includes:
an evaporator configured to evaporate a liquid phase of a working fluid to generate vapor, the evaporator including a first inner surface and a second inner surface, the first inner surface and the second inner surface facing each other;

a comb-like porous body including a plurality of comb teeth in a plan view of the loop heat pipe, the comb-like porous body being disposed inside the evaporator;
a plurality of grooves disposed on at least one of the first inner surface or the second inner surface, such that the plurality of grooves respectively overlap the plurality of comb teeth in the plan view;
a vapor transport line configured to transport the vapor of the working fluid;
a condenser configured to liquefy the vapor of the working fluid; and
a liquid transport line configured to transport the liquefied vapor as the liquid phase of the working fluid,
wherein each of the liquid transport line and the vapor transport line connects the evaporator and the condenser, such that the vapor transport line and the liquid transport line form a loop-like flow passage.

* * * * *